US005504687A

United States Patent [19]
Wolf

[11] Patent Number: 5,504,687
[45] Date of Patent: Apr. 2, 1996

[54] APPARATUS FOR AUTOMATED MACHINERY COMPONENT SELECTION

[75] Inventor: Mike Wolf, Hamshire, Ill.

[73] Assignee: Vescor Corporation, South Elgin, Ill.

[21] Appl. No.: 344,901

[22] Filed: Nov. 22, 1994

[51] Int. Cl.$^6$ .................................................. G06F 19/00
[52] U.S. Cl. .................... 364/468; 364/401; 364/474.24; 364/512
[58] Field of Search .................................. 364/468, 401, 364/402, 403, 474.24, 512; 395/919

[56] References Cited

U.S. PATENT DOCUMENTS

| | | | |
|---|---|---|---|
| 5,134,560 | 7/1992 | Ferriter et al. | 364/468 X |
| 5,311,437 | 5/1994 | Leal et al. | 364/468 |
| 5,339,247 | 8/1994 | Kirihara et al. | 364/468 |
| 5,357,440 | 10/1994 | Talbott et al. | 364/468 |
| 5,369,570 | 11/1994 | Parad | 364/468 X |

*Primary Examiner*—Joseph Ruggiero
*Attorney, Agent, or Firm*—McAndrews, Held & Malloy, Ltd.

[57] ABSTRACT

A method and apparatus for automatically selecting components for a particular machinery application. The apparatus includes a computing device having a memory, a data input device, at least one database in the memory, an application program, a display device, and an output device. The database contains a plurality of files concerning the components and the machinery. The application program is executed in the computing device and interactively displays a series of screens that prompt a user to input data concerning the machinery and concerning the desired parameters of the components. The program then compares the user inputted data with the database files and interactively generates output data concerning the proper components for the particular machinery application. The program then utilizes the output data to select the proper components for the particular machinery application and displays information concerning the components. The program presents the output data indicating the selected proper components on the display device and the output device so that the proper components may be purchased by the user.

4 Claims, 11 Drawing Sheets

SAE GENERIC

Generic Information Input

| Field | Value | Unit |
|---|---|---|
| Number of Bolts in Bolt Circle | 2 | |
| Bolt Angle (90° Standard) | 90 | |
| Bolt Circle Diameter | 5.750 | inches |
| Bolt Hole Type | THRU | |
| Bolt Diameter | 0.500 | inches |
| Pilot diameter | 4.000 | inches |
| Pilot length | | inches |
| Shaft has a spline? | | |
| Width of keyway (if no spline) | | inches |
| Shaft length | | inches |
| Shaft/Spline major diameter | | inches |

Generic Style
SAE, SAE B

Continue   Cancel

Copyright © 1994 by VESCOR Corp

FIG. 9

ISO GENERIC

Generic Information Input

| Number of Bolts in Bolt Circle | 2 | |
| Bolt Angle (90° Standard) | 90 | |
| Bolt Circle Diameter | 109.000 | mm |
| Bolt Hole Type | THRU | |
| Bolt Diameter | 10.000 | mm |
| Pilot diameter | 80.000 | mm |
| Pilot length | | mm |
| Shaft has a spline? | | |
| Width of keyway (if no spline) | | mm |
| Shaft length | | mm |
| Shaft/Spline major diameter | | mm |

Generic Style
ISO 80A2

[Continue] [Cancel]

Copyright © 1994 by VESCOR Corp

FIG. 10

VESCOR CORPORATION
50 North River Street   South Elgin, Illinois 60177
(708)742-7270  Fax-(708)742-2905

FIG.11

Selected Motor Size: 215TC with 10.000 hp at 1800 rpm.
Motor shaft diameter is 1.375 inches that is 3.125 inches long
  and has a 0.312 inch square key.
Selected Pump Vendor: NACHI.
Selected Pump Model: VDC-12B-*A*-*A*-*20 with 4 bolts.
  (Pump type: UNDEFINED)
Pump shaft diameter is 1.000 inches that is 2.360 inches long
  and has a 0.187 inch square key.
The SOX OCT spider required is a Lovejoy L-100 11492.
The first coupling half required is a Lovejoy 37259
  (1.000 inch bore, 0.188 inch square key).
The second coupling half required is a Lovejoy 11522
  (1.375 inch bore, 0.312 inch square key).

The housing part number is 1931 with an actual length of 6.375 inches.
There is no adapter ring required for this adapter.
The allowable adapter mounting orientation is horizontal only.
NOTE: This is an undampened design.

The section below is shown through the narrowest cross section.

SOX OCT Spider Part #L-100 11492
Coupling half Part #37259
Coupling half Part #11522
Adapter Part #1931

S/N #1456873250
Copyright © 1994, VESCOR Corp.

5,504,687

APPARATUS FOR AUTOMATED MACHINERY COMPONENT SELECTION

FIELD OF THE INVENTION

The present invention relates generally to selection of components for machinery applications, and more particularly to a method and apparatus for automated selection of couplings and adapters for particular rotating machinery applications.

A portion of the disclosure of this patent document contains material which is subject to copyright protection. The copyright owner has no objection to the facsimile reproduction by anyone of the patent document or the patent disclosure, as it appears in the Patent and Trademark Office file or records, but otherwise reserves all copyright rights whatsoever.

BACKGROUND OF THE INVENTION

The manual selection of couplings and adapters for rotating machinery is well known in the art. In the typical rotating machinery application, a particular piece of machinery with a rotating shaft such as a centrifugal pump, compressor, blower, or the like, is driven by a particular prime mover, e.g., an electric motor, a diesel engine, or the like. A user must select a proper coupling to connect the shaft of the rotating machinery with the shaft of the prime mover, and then must select a proper adapter to enclose the coupling and mount the prime mover to the rotating machinery. The coupling must be selected based on multiple variable parameters such as speed, torque, and dimensional data depending upon the particular machinery application. Couplings, adapters, prime movers, and rotating machinery typically are produced by different manufacturers and supplied by different vendors, necessitating an exhaustively iterative manual selection procedure using separate manufacturers' and vendors' catalogs and data sheets to ensure that the components interact properly for the particular machinery application. This manual procedure is time consuming and error prone and often results in improperly selected couplings and adapters.

OBJECTS AND SUMMARY OF THE INVENTION

It is therefore an object of the present invention to provide an improved method and apparatus for automated selection of machinery components.

It is a further object of the present invention to provide an improved method and apparatus for automated selection of couplings and adapters for particular rotating machinery applications.

These objects are achieved by providing an apparatus according to the present invention that includes a computing device having a memory device, a data input device, at least one database in the memory device, an application program, a visual display device, and an output device. The database contains a plurality of files concerning the components and the machinery.

According to the method of the present invention, the application program is executed in the computing device and interactively displays a series of screens on the visual display device that prompt a user to input data concerning the machinery and concerning the desired specifications of the components. The application program then compares the user inputted data with the database files and interactively generates output data concerning the proper components for the particular machinery application. The program then utilizes the output data to select the proper components for the particular machinery application and displays information concerning the components. The program presents the output data indicating the selected proper components on the visual display device and also allows the user to output the data on the output device so that the proper components may be purchased by the user.

In accordance with a more specific aspect of the invention, the database includes files containing information about particular machinery such as pumps and motors and particular components such as couplings and adapters.

According to the present invention, the application program interactively prompts a user to input data concerning the machinery and the components, compares the inputted data to the database files, generates information concerning the components for the particular machinery application, and displays and outputs the information so that the proper components for a particular machinery application may be purchased by the user. Thus, the time consuming and error prone iterative manual process of machinery component selection is eliminated.

These and other features of the present invention are discussed or apparent in the following detailed description.

BRIEF DESCRIPTION OF THE DRAWINGS

A preferred embodiment of the present invention is described herein with reference to the drawings wherein.

DETAILED DESCRIPTION OF THE PREFERRED EMBODIMENT

Figure 1:
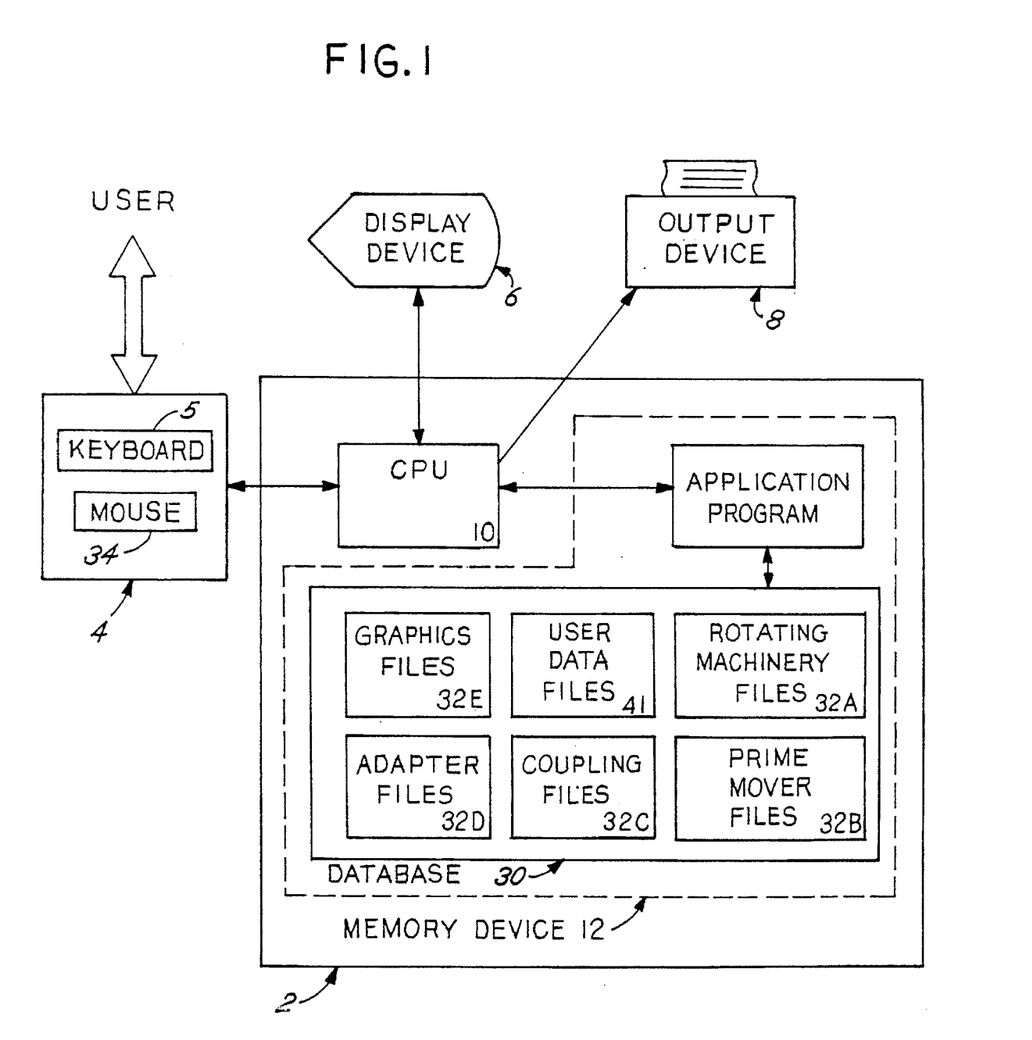
FIG. 1 is a block diagram of the apparatus of the present invention.

Referring to FIG. 1, a preferred embodiment of the present invention is shown as an improved apparatus for automated selection of machinery components having a computing device 2, a data input device 4, a visual display device 6, and an output device 8. In the preferred embodiment, the computing device 2 includes a central processing unit ("CPU") 10 and a memory device 12. An application program 20 and a database 30 are stored within the memory device 12.

The computing device 2 may be a standard desktop personal computer with a hard disk drive, a 3.5" floppy disk drive, a standard disk operating system, and all necessary standard peripherals. The CPU 10 may be any IBM compatible processor such as 80386 or better. The memory device 12 may include a 40 megabyte ("MB") hard disk and at least 4 MB extended random access memory ("RAM"). The data input device 4 may include a standard 101-key keyboard 5 and an IBM compatible mouse 34. The visual display device 6 may be a standard computer monitor such as a VGA color monitor with necessary display card, capable of displaying alphanumeric characters. The output device 8 may be any standard computer printer compatible with the computing device 2. Alternatively, the output device 8 may be a standard modem or facsimile modem for remotely communicating output data with other personal computers or facsimile machines. These and many other suitable components and peripherals for typical desktop personal computers will be known to those skilled in the art.

Figure 2:
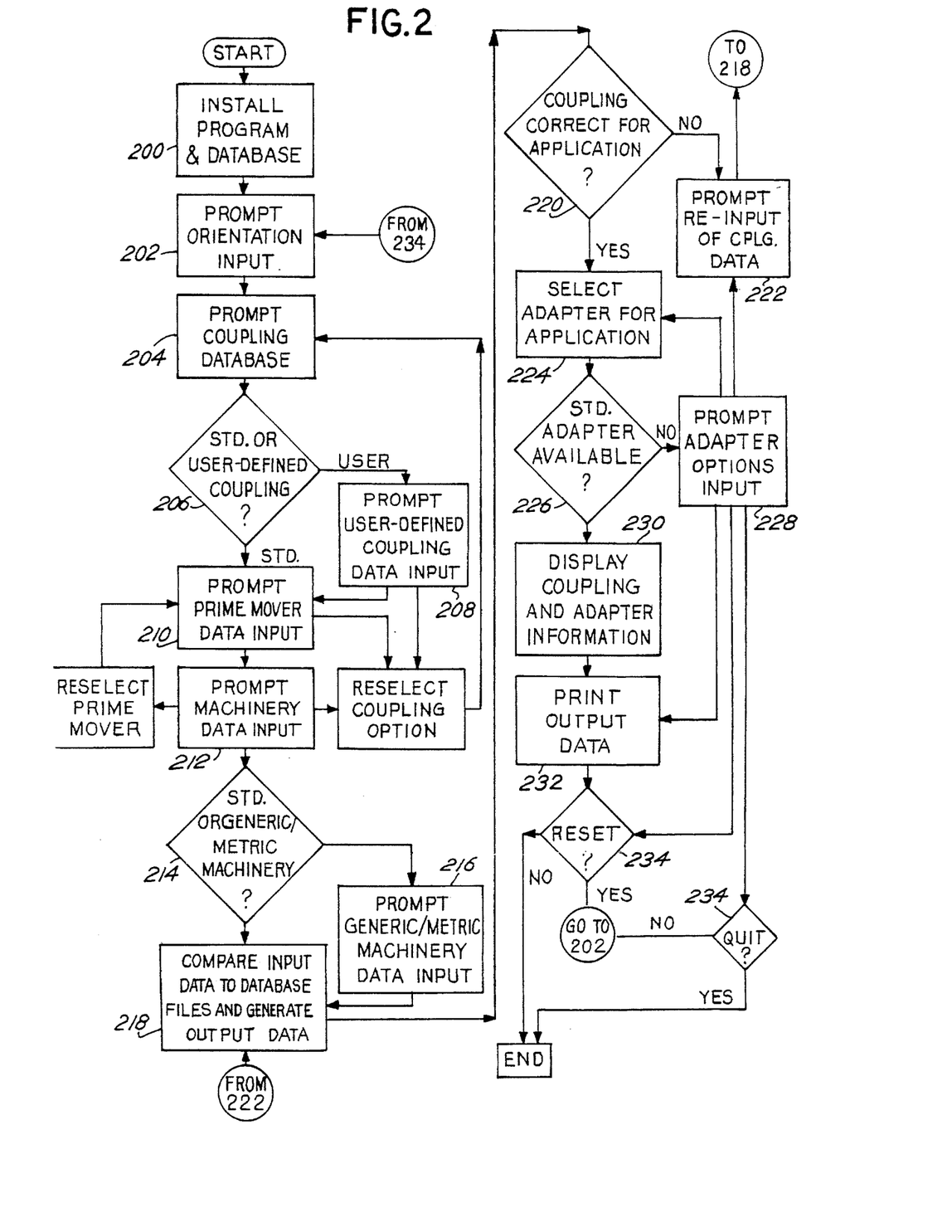
FIG. 2 is a flow chart showing the logic and sequence of the computer application program of the present invention.

The computer program listing for application program 20, produced in accordance with the specific example of the present invention described herein, is set forth in the appendix. Referring to FIG. 2, there is shown a flow chart of the logic of the application program 20 utilized in the preferred embodiment of the present invention. One skilled in the art can write the source code for the application program 20 from this flow chart in any suitable computer language such as BASIC, Pascal or C, for any desired computing device 2 that supports those languages.

The database 30 may be one of several commercial database products currently available, such as DATABASE 2 or ALPHA 4. It will be understood by those skilled in the art that the database 30 could be encrypted from any standard relational or hierarchical database, translated into standard ASCII computer files, and included within the software of the application program 20 or stored separately within the memory device 12.

The database 30 includes a plurality of database files 32 containing information concerning specific machinery and components. In one embodiment, for example, a database file 32A contains information about specific rotating machinery such as centrifugal pumps. Such information may include the pump manufacturer name, the pump model number, various pump dimensional data, pump capacity, and horsepower requirements. Another database file 32B contains information about specific prime movers such as electric motors. Such information may include the motor manufacturer name, the motor model number, various motor dimensional data, and horsepower output. An additional database file 32C contains information about specific couplings such as manufacturer name and model number, dimensional data, speed and torque requirements. Another database file 32D contains information about specific adapters for various particular pump/motor/coupling applications, such as adapter dimensional data, pump mounting flange data, motor mounting flange data, and type and number of bolts and gaskets required for the adapter. Finally, another database file 32E contains graphics for visual display device screens to be displayed on the visual display device 6.

Although this embodiment illustrates one preferred configuration of the database 30 and content of the database files 32, those skilled in the art will appreciate that the database 30 and the database files 32 may be configured in many other ways to contain additional information and data depending upon the particular machinery and components involved.

Referring again to FIG. 2, a flow chart of the preferred logic of the application program 20 of the present invention is illustrated. In practicing the present invention, at the installation sequence step 200, a user, having been provided with the application program 20 and the database 30 for a desired type of machinery and component application, begins a normal computer software installation sequence whereby the application program 20 and the database 30 are installed in the memory device 12. Thereafter, the user may operate the computing device 2 causing execution of the application program 20. Those skilled in the art will appreciate that the installation sequence step 200 involves downloading the application program 20 and the database 30 from a common portable storage medium such as a 3.5" floppy disk or CD-ROM into the memory device 12.

Figure 3:
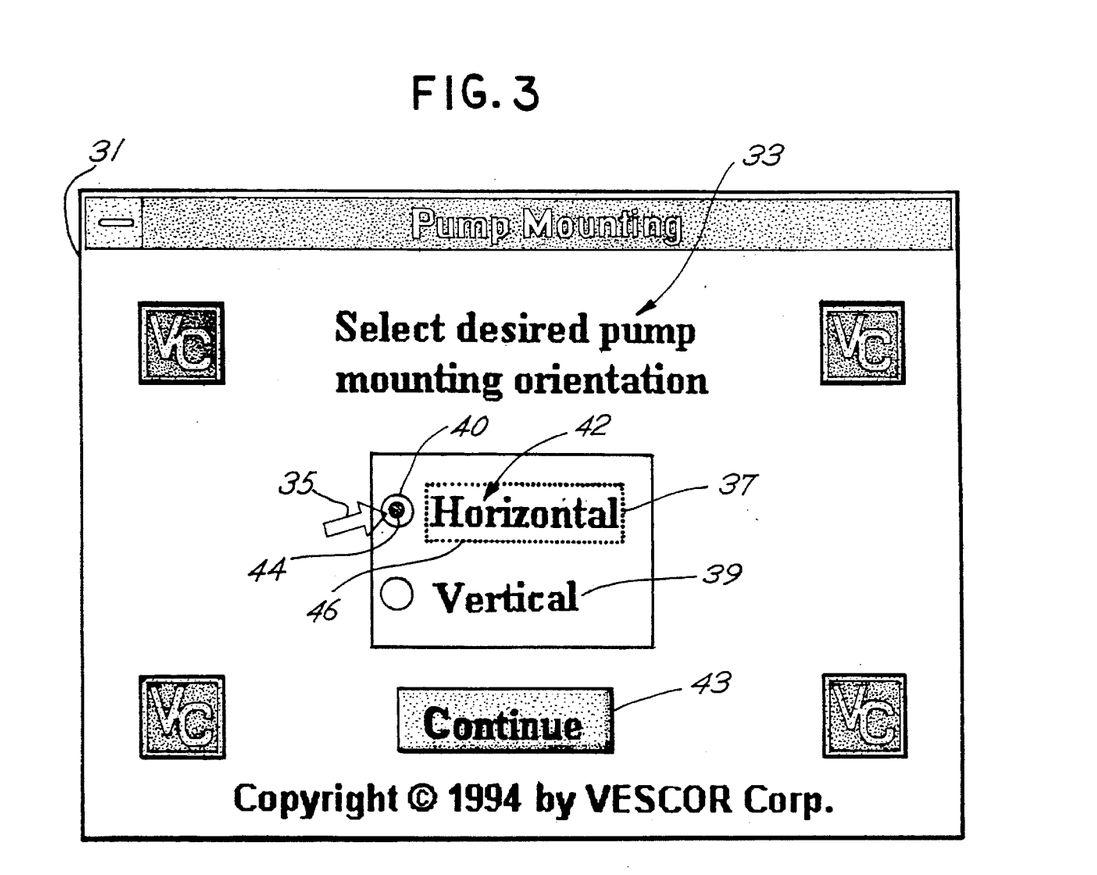
FIG. 3 is a visual display device screen illustrating a display for inputting desired pump mounting orientation.

At step 202, the application program 20 causes the visual display device 6 to display a screen 31 shown in FIG. 3. The graphics for screen 31 are stored in database file 32E and are retrieved from memory device 12 by application program 20 and displayed on visual display device 6. Screen 31 interactively prompts the user to input data concerning the particular machinery orientation of the user's machinery application, i.e., the desired pump mounting orientation. Visual indicia 33 instructs the user as to the information data to be input, i.e., "SELECT DESIRED PUMP MOUNTING ORIENTATION". Using the arrow keys of keyboard 5 or the mouse 34 (FIG. 1), arrow cursor 35 (FIG. 3) is positioned onto either one of two visual indicia 37 or 39 for instructing application program 20 as to which information is to be input, i.e., either a horizontal mounting, by clicking the cursor 35 on indicia 37, or a vertical mounting, by clicking the cursor 35 on indicia 39. Indicia 37, 39 each include a circle 40 and an alphabetical word 42. A darkened second circle 44 and a dotted box 46 are used to highlight indicia 37 so that pressing the <ENTER> key of keyboard 5 or the appropriate enter key of mouse 34 will input the input data of indicia 37. Alternatively, manipulation of the mouse 34 or the arrow keys of keyboard 5 will scroll circle 44 and dotted box 46 to indicia 39 to permit input of the information of indicia 39 by pressing the <ENTER> key of keyboard 5 or the appropriate enter key of mouse 34. Those skilled in the art will appreciate that in any of the steps of FIG. 2 the arrow cursor 35 may be positioned alternatively on any of the indicia displayed on visual display device 6 by manipulation of the mouse 34 or use of the arrow keys of keyboard 5 and may be actuated alternatively by pressing the <ENTER> key of keyboard 5 or the appropriate enter key of mouse 34. The application program 20 internally stores the input data of the particular orientation selected in database 30 in a user data file 41 (FIG. 1) for use in later steps of program execution. Alternatively, those skilled in the art will recognize that the application program 20 may internally store data and information in the memory device 12, in the RAM of the computing device 2, or in any other internal memory storage apparatus common to personal desktop computers. Thus, the user data file 41 may be created by application program 20.

As shown in FIG. 3, "CONTINUE" visual indicia 43 is displayed on screen 31 to provide user instruction to continue the program sequence. Actuation of cursor arrow 35 on indicia 43 sends the program sequence to step 204 of FIG. 2.

Figure 4:
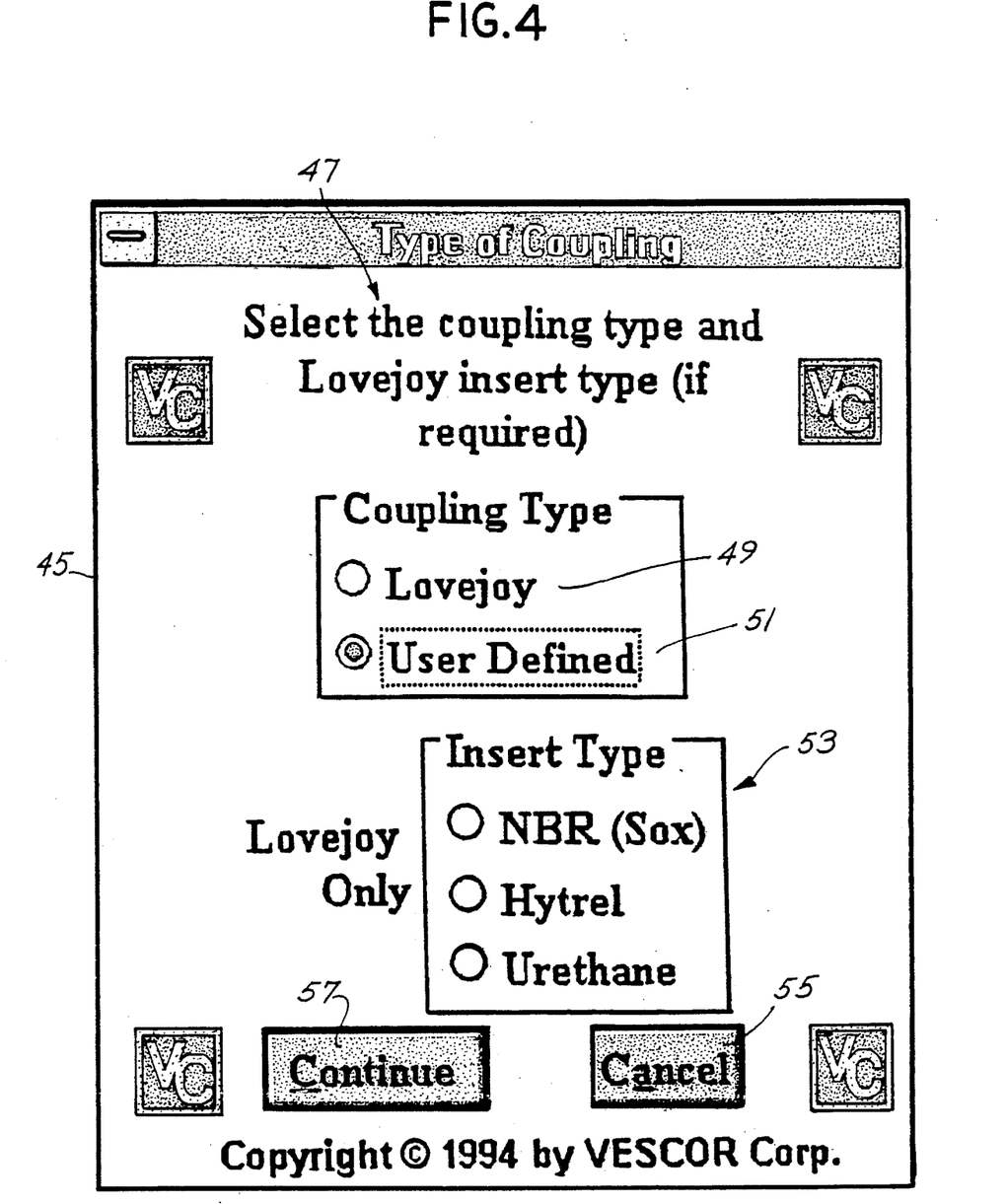
FIG. 4 is a visual display device screen illustrating a display for inputting desired type of coupling.

At step 204, the application program 20 next causes visual display device 6 to display a screen 45 shown in FIG. 4. The graphics for screen 45 are stored in database file 32E and are retrieved from memory device 12 by application program 20 and displayed on visual display device 6. Screen 45 interactively prompts the user to input data concerning the type of coupling desired. The user is prompted by visual indicia 47 to "SELECT THE COUPLING TYPE AND LOVEJOY INSERT TYPE (IF REQUIRED)." Data input indicia 49, 51 are provided for selection of the coupling type. Indicia 49 is used to select "LOVEJOY" type of coupling, and indicia 51 is used to select "USER DEFINED" type of coupling. Those skilled in the art will recognize that "LOVEJOY" in this embodiment refers to a particular rotating machinery coupling manufacturer, however many other equally suitable coupling types, insert materials, and manufacturers could be selected from screen 45 of FIG. 4 by adding other visual indicia. If "LOVEJOY" is selected, indicia 53 prompts the user to select the insert type, i.e., either NBR (Sox), HYTREL, or URETHANE. The data selected is stored by application program 20 in user data file 41.

A "CANCEL" visual indicia 55 is used to permit the user to cancel the inputs from screen 45 and to begin again to input data using screen 45. User actuation of the "CONTINUE" visual indicia 57 transfers the application program 20 to step 206.

At step 206, the application program 20 determines whether the user has selected a "LOVEJOY" coupling or a "USER DEFINED" coupling. If a "LOVEJOY" coupling was selected, the application program 20 moves to step 210. If a "USER DEFINED" coupling was selected, the application program 20 moves to step 208 and causes the visual display device 6 to display a screen 59 shown in FIG. 5. The graphics for screen 59 are stored in database file 32E and are retrieved from memory device 12 by application program 20 and displayed on visual display device 6. Screen 59 interactively prompts the user to input data concerning the user defined coupling.

Figure 5:
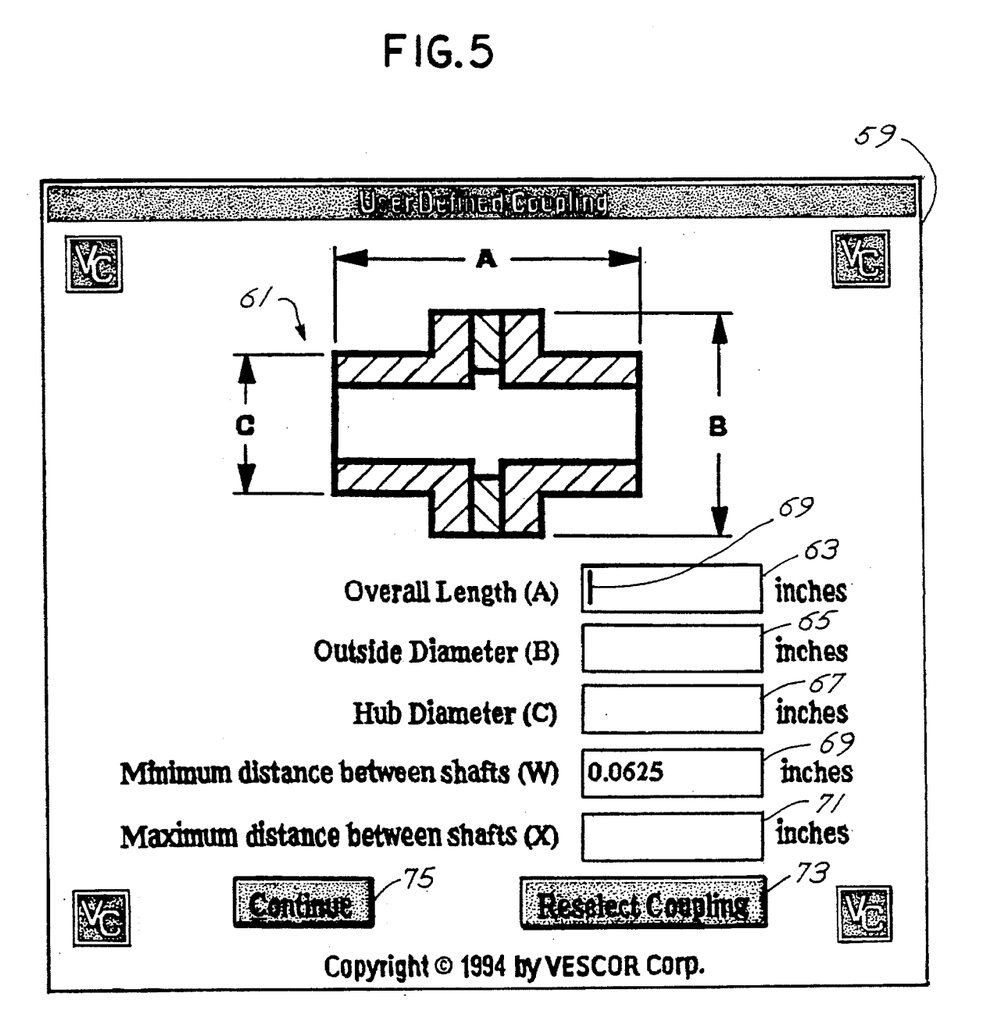
FIG. 5 is a visual display device screen illustrating a display for inputting user defined coupling information.

Screen 59 includes a drawing 61 diagrammatically representing a coupling and indicating an overall length dimension A, an outside diameter dimension B, and a hub diameter dimension C. These three dimensions A, B, C must be input by the user. Three input boxes 63, 65, 67 are visually displayed on screen 59 for use to input dimensions A, B, C. A cursor bar 69 flashes to indicate to the user that the user should begin typing the length dimension A, in numerals, into box 63 using keyboard 5. Once the length dimension has been typed into box 63, the user actuates the <ENTER> key of keyboard 5. The cursor then moves to box 65, signalling the user to begin typing the outside diameter dimension B. Once the outside diameter dimension has been typed into box 65 using keyboard 5, the user actuates the <ENTER> key of keyboard 5. The cursor then moves to box 67, signalling the user to begin typing the hub diameter dimension C. In like manner, the user enters data at boxes 67, 69, 71. A default minimum value appears in box 69. The user may change this default value as desired. Those skilled in the art will appreciate that entry of any alphanumeric data during any of the steps of FIG. 2 is accomplished in like manner via keyboard 5.

The application program 20 internally stores the user inputted data for the coupling selected in user data file 41. This data is used in later steps of program execution. A "RESELECT COUPLING" visual indicia 73 is used to permit the user to cancel the inputs from screen 59 and to return application program 20 to step 204 to input data using screen 45 of FIG. 4. User actuation of the "CONTINUE" visual indicia 75 transfers the application program 20 to step 210.

Figure 6:
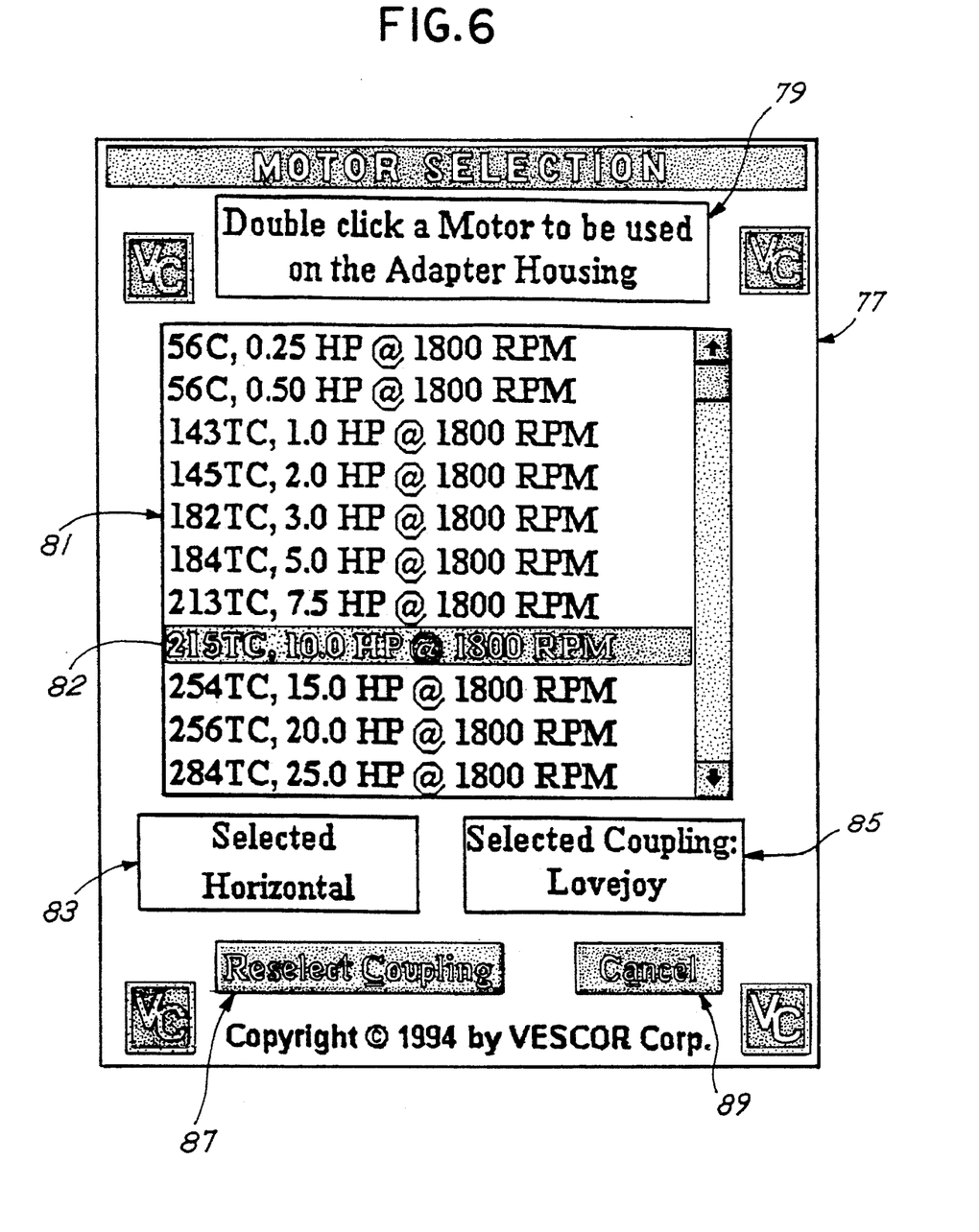
FIG. 6 is a visual display device screen illustrating a display for inputting desired motor selection information.

At step 210, the application program 20 next causes visual display device 6 to display a screen 77 shown in FIG. 6. The graphics for screen 77 are stored in database file 32E and are retrieved from memory device 12 by application program 20 and displayed on visual display device 6. Screen 77 interactively prompts the user to input data concerning the type of prime mover desired. The application program 20 retrieves the specifications for prime movers from database file 32B and displays them on the visual display device 6 in box 81 of screen 79. Said specifications may be National Electrical Manufacturers' Association ("NEMA") standard frame configuration, horsepower, and revolutions per minute ("RPM"). In this embodiment, the user is prompted to select a motor by visual indicia 79 to "DOUBLE CLICK A MOTOR TO BE USED ON THE ADAPTER HOUSING." Using the arrow keys of keyboard 5 or the mouse 34 (FIG. 1), the user scrolls down the motor specifications displayed in box 81 and selects a motor of the desired standard motor frame configuration, horsepower, and RPM. The user positions the bar cursor 82 on the desired motor and actuates either the <ENTER> key of keyboard 5 or the appropriate enter key of mouse 34. The application program 20 internally stores the input data of the particular motor selected in the user data file 41 (FIG. 1) for use in later steps of program execution.

Visual indicia 83 in screen 77 displays for the user's reference the machinery orientation previously selected in step 202. Visual indicia 85 displays for the user's reference the coupling previously selected in steps 204–208. A "RESELECT COUPLING" visual indicia 87 is used to permit the user to cancel the inputs from screen 77 and to return to step 204 to reinput coupling data using screen 45 of FIG. 4. The "CANCEL" visual indicia 89 is used to permit the user to cancel the inputs from screen 77 and to begin again to input data using screen 77. Actuating a motor selection on screen 77 transfers the application program 20 to step 212.

Figure 7:
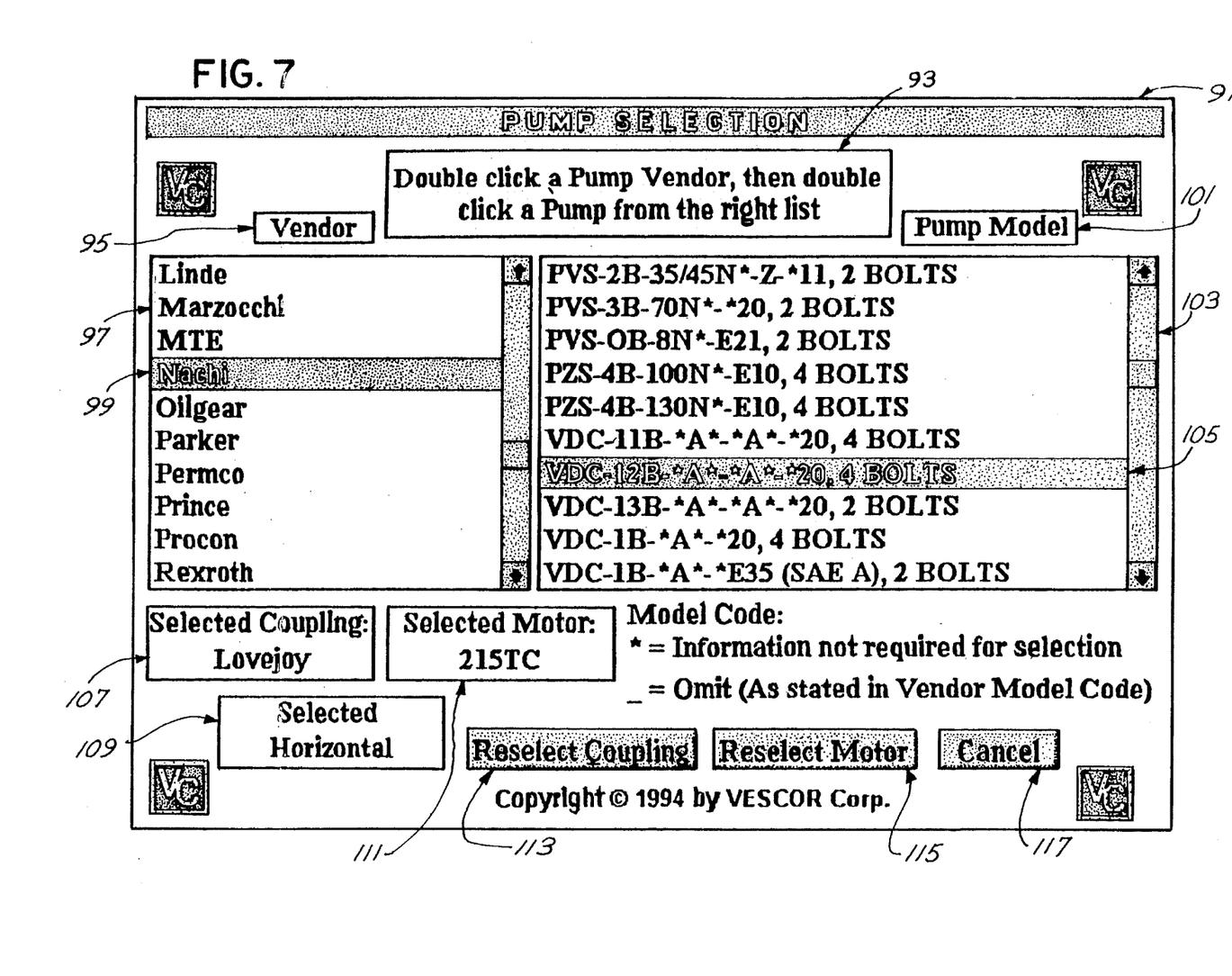
FIG. 7 is a visual display device screen illustrating a display for inputting desired pump selection information.

At step 212, the application program 20 next causes visual display device 6 to display a screen 91 shown in FIG. 7. The graphics for screen 91 are stored in database file 32E and are retrieved from memory device 12 by application program 20 and displayed on visual display device 6. Screen 91 interactively prompts the user to input data concerning the type of rotating machinery desired. The application program 20 retrieves the specifications for rotating machinery from database file 32A and displays them on the visual display device 6 in boxes 97 and 103 of screen 91. In this embodiment, the user is prompted by visual indicia 93 of screen 91 to "DOUBLE CLICK A PUMP VENDOR, THEN DOUBLE CLICK A PUMP FROM THE RIGHT LIST". Visual indicia 95 indicates that box 97 is used to select "VENDOR" and visual indicia 101 indicates that box 103 is used to select "PUMP MODEL". The user scrolls down box 97, positions the cursor bar 99 on the desired pump vendor name, and actuates either the <ENTER> key of keyboard 5 or the appropriate enter key of mouse 34. Next, the user scrolls down box 103 on the right side of screen 91, positions the cursor bar 99 on the desired pump model number, and actuates either the <ENTER> key of keyboard 5 or the appropriate enter key of mouse 34. The application program 20 internally stores the input data of the particular motor selected in the user data file 41 (FIG. 1) for use in later steps of program execution.

Visual indicia 109 in screen 91 displays for the user's reference the machinery orientation previously selected in step 202. Visual indicia 107 displays for the user's reference the coupling previously selected in steps 204–208. Visual indicia displays for the user's reference the motor previously selected in step 210. The "RESELECT COUPLING" visual indicia 113 is used to permit the user to cancel the inputs from screen 91 and to return to step 204 to reinput coupling data using screen 45 of FIG. 4. The "RESELECT MOTOR"

visual indicia 115 is used to permit the user to cancel the inputs from screen 91 and to return to step 210 to reinput motor data using screen 77 of FIG. 6. The "CANCEL" visual indicia 117 is used to permit the user to cancel the inputs from screen 91 and to begin again to input data using screen 91. Actuating a pump selection on screen 91 transfers the application program 20 to step 218.

In this embodiment, box 97 also includes an option allowing the user to select a Society of Automotive Engineers ("SAE") generic pump mounting flange or an "ISO" metric pump mounting flange instead of a particular machinery vendor and model number. The user scrolls down box 97, positions the cursor bar 99 on the desired "SAE GENERIC" or "ISO METRIC" selection and actuates either the <ENTER> key of keyboard 5 or the appropriate enter key of mouse 34. Next, the user scrolls down box 103 on the right side of screen 91, positions the cursor bar 99 on the desired generic flange information corresponding to the user's desired generic or metric pump flange application, and actuates either the <ENTER> key of keyboard 5 or the appropriate enter key of mouse 34. The application program 20 internally stores the input data of the generic or metric pump flange selected in the user data file 41 (FIG. 1) for use in later steps of program execution. Actuating a SAE generic or ISO metric pump mounting flange selection on screen 91 in this manner transfers the application program 20 to step 216.

Figure 8:
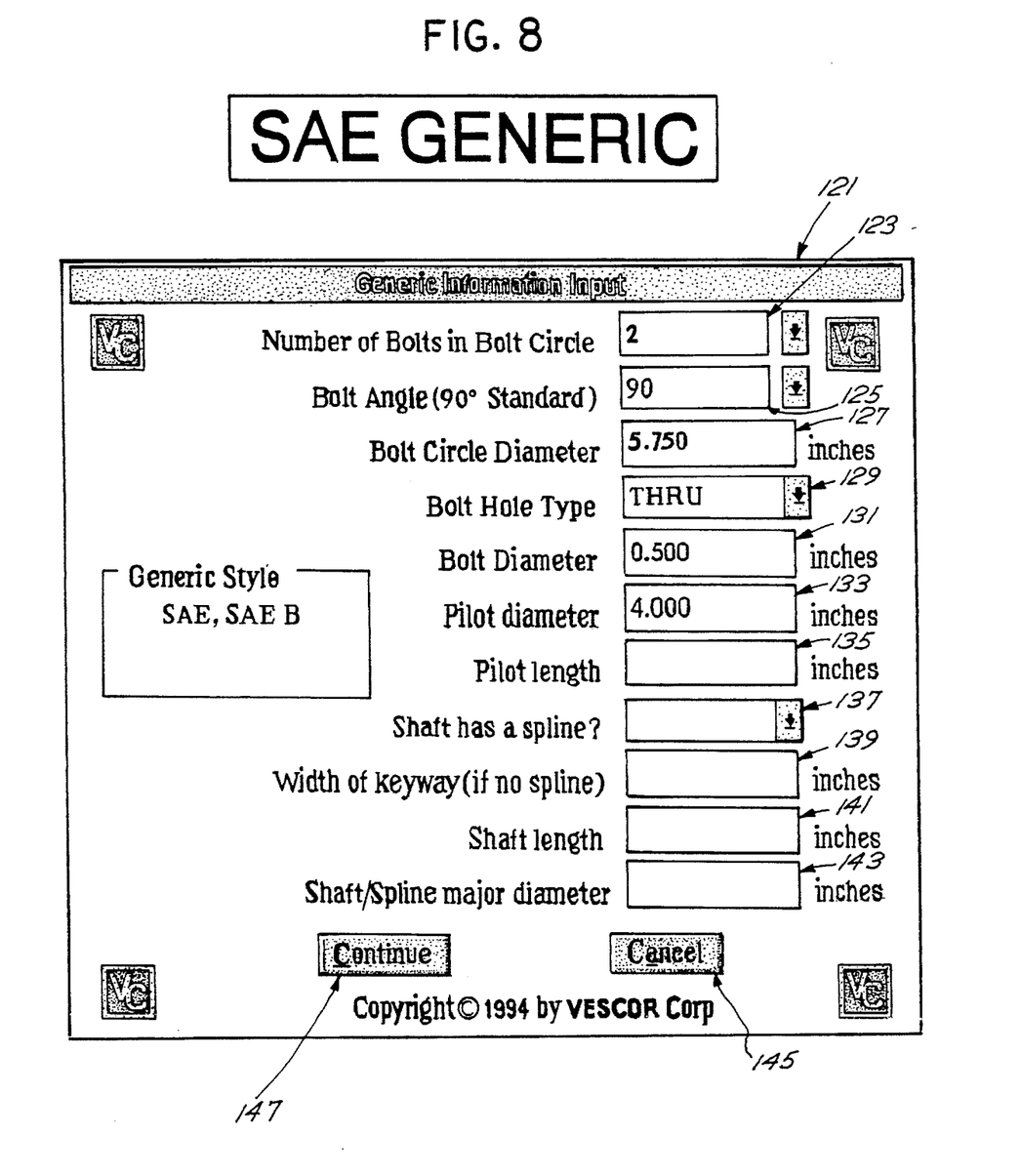
FIGS. 8 & 9 are visual display device screens illustrating displays for inputting alternate generic or metric pump information.
Figure 9:
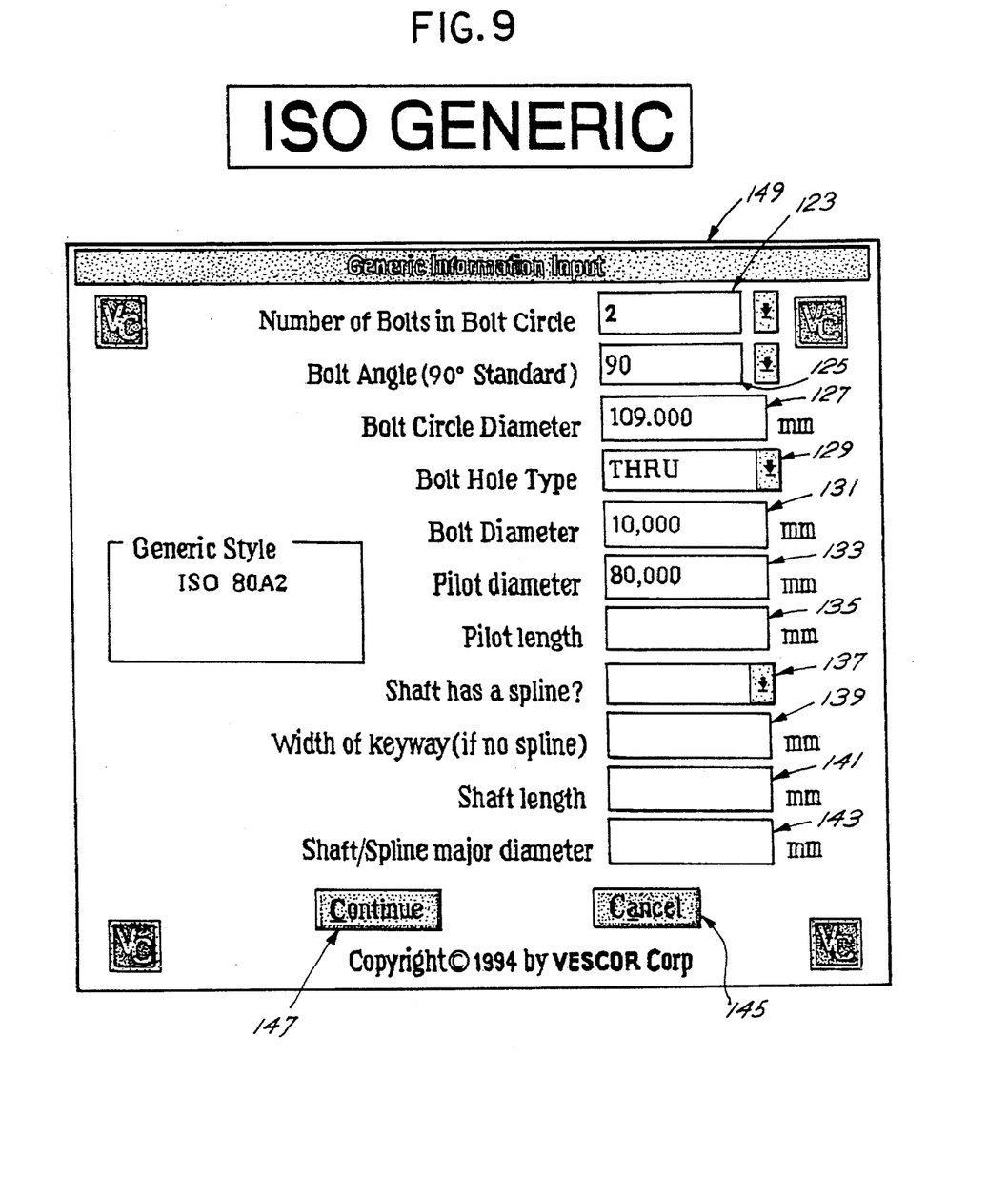

At step 216, the application program 20 next causes visual display device 6 to display either screen 121 shown in FIG. 8 (SAE generic mounting flange) or screen 149 shown in FIG. 9 (ISO metric mounting flange). The graphics for screens 121 and 149 are stored in database file 32E and are retrieved from memory device 12 by application program 20 and displayed on visual display device 6. Screens 121 and 149 interactively prompt the user to input data concerning the type of SAE generic or ISO metric rotating machinery desired. The application program 20 retrieves certain specifications for the rotating machinery from database file 32A and displays them on the visual display device 6 in boxes 123–133 of screens 121 or 149. Such specifications may include number of bolts in bolt circle (boxes 123), bolt angle (boxes 125), bolt circle diameter (boxes 127), bolt hole type (boxes 129), bolt diameter (boxes 131), and pilot diameter (boxes 133). Next the user is prompted by screen 121 or 149 to input specific generic or metric pump data such as pilot length (boxes 135), shaft configuration, i.e., with or without spline (boxes 137), width of keyway (boxes 139), shaft length (boxes 141), and shaft/spline major diameter (boxes 143). The application program 20 internally stores the input data of the particular generic or metric pump selected in the user data file 41 (FIG. 1) for use in later steps of program execution. The "CANCEL" visual indicia 145 on screens 121 and 149 is used to permit the user to cancel the inputs from screen 121 or 149 and to begin again to input data using screen 121 or 149. Selecting a generic or metric pump selection by actuating the "CONTINUE" visual indicia 147 on screen 121 or 149 transfers the application program 20 to step 218.

At step 218, the application program 20 compares all of the heretofore inputted and internally stored data in user data file 41 concerning the desired machinery and components with the database files 32 corresponding to the inputted data. The application program 20 then generates output data regarding the proper components for the particular machinery and prime mover application and moves to step 220. At step 220, the application program 20 internally compares the input data to the output data and determines whether the coupling and motor selected by the user is proper for the pump application specified by the user. For example, by comparing input and output data, the application program 20 may determine that the coupling insert selected by the user is incorrect for the RPM and torque selected, or the shaft diameter of the desired motor selected is incompatible with the dimensions of the coupling selected. Those skilled in the art will appreciate that step 220 may include comparison of many other parameters of machinery and components. If the application program 20 determines that the coupling is incorrect, at step 222 it causes the visual display device 6 to redisplay screen 45 of FIG. 4 which interactively prompts the user to reinput coupling data. After the user reinputs the necessary coupling data, the application program 20 reperforms the comparison of steps 218 and 220 and the re-input step 222 until the comparison steps 218 and 220 indicate that the selected components and machinery are compatible, and then transfers to step 224.

Figure 10:
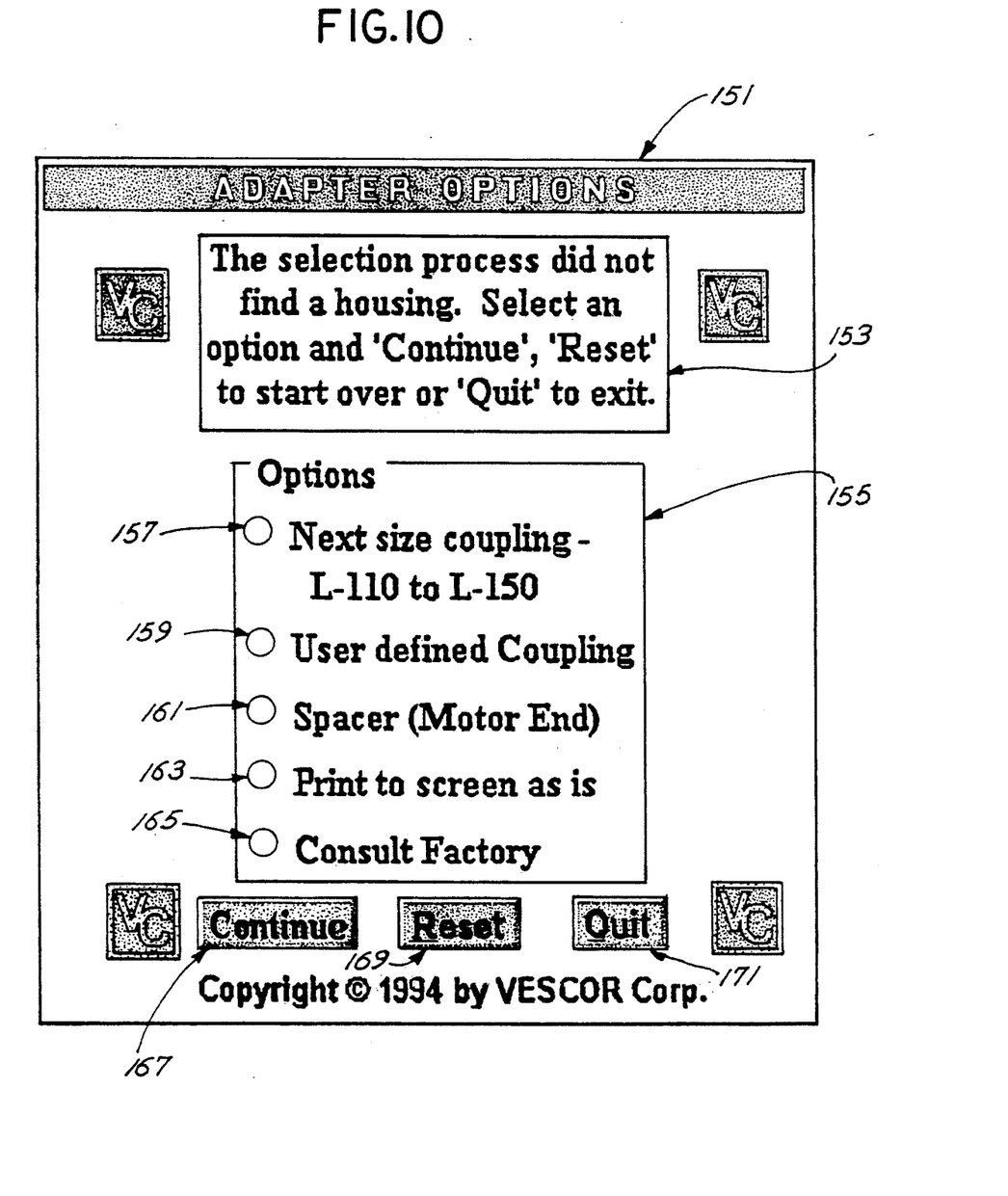
FIG. 10 is a visual display device screen illustrating a display for inputting desired adapter options.

At step 224, the application program 20 next utilizes the previously internally stored data in the user data file concerning the components and machinery to select the proper adapter for the particular application. Proceeding to step 226, the application program 20 compares the internally stored data and generates output data concerning an adapter suitable for the application. The application program 20 then compares the generated output data with the database files 32D corresponding to available standard adapters. If the application program 20 determines that a standard adapter is not available, at step 228 it causes the visual display device 6 to display screen 151 of FIG. 10. The graphics for screen 151 are stored in database file 32E and are retrieved from memory device 12 by application program 20 and displayed on visual display device 6. Screen 151 interactively prompts the user to select certain options. The user first is prompted by visual indicia 153 as follows: "THE SELECTION PROCESS DID NOT FIND A HOUSING. SELECT AN OPTION AND 'CONTINUE', 'RESET', TO START OVER OR 'QUIT' TO EXIT." Such options are displayed in box 155 and are selected by scrolling to the desired visual indicia 157–165 and actuating either the <ENTER> key of keyboard 5 or the appropriate enter key of mouse 34, then highlighting "CONTINUE" visual indicia 167. Such options may include reselecting the next size coupling (visual indicia 157), selecting a user defined coupling (visual indicia 159), selecting addition of a spacer to the motor end (visual indicia 161). Spacers add a specific length to the overall pump-to-motor dimension of the adapter. Finally, visual indicia 163 allows the user to print the previously inputted data to ensure that all components were selected correctly. The user may then select "CONSULT FACTORY" visual indicia 165 so that the application program 20 internally stores previously inputted data in the user data file 41 for later output and use by the user to discuss selection of the proper components with the manufacturer. "RESET" visual indicia 169 is used to permit the user to cancel the option selected from screen 151 and to begin the machinery component selection process again at step 202. The "QUIT" visual indicia 171 allows the user to exit the application program 20 without reperforming any steps of FIG. 2. or proceeding to step 230. If the user continues to reinput options, the application program 20 will continue to store inputted data in user data file 41 and to reexecute steps 224–228 until a standard adapter is found, and then will transfer to step 230.

Figure 11:
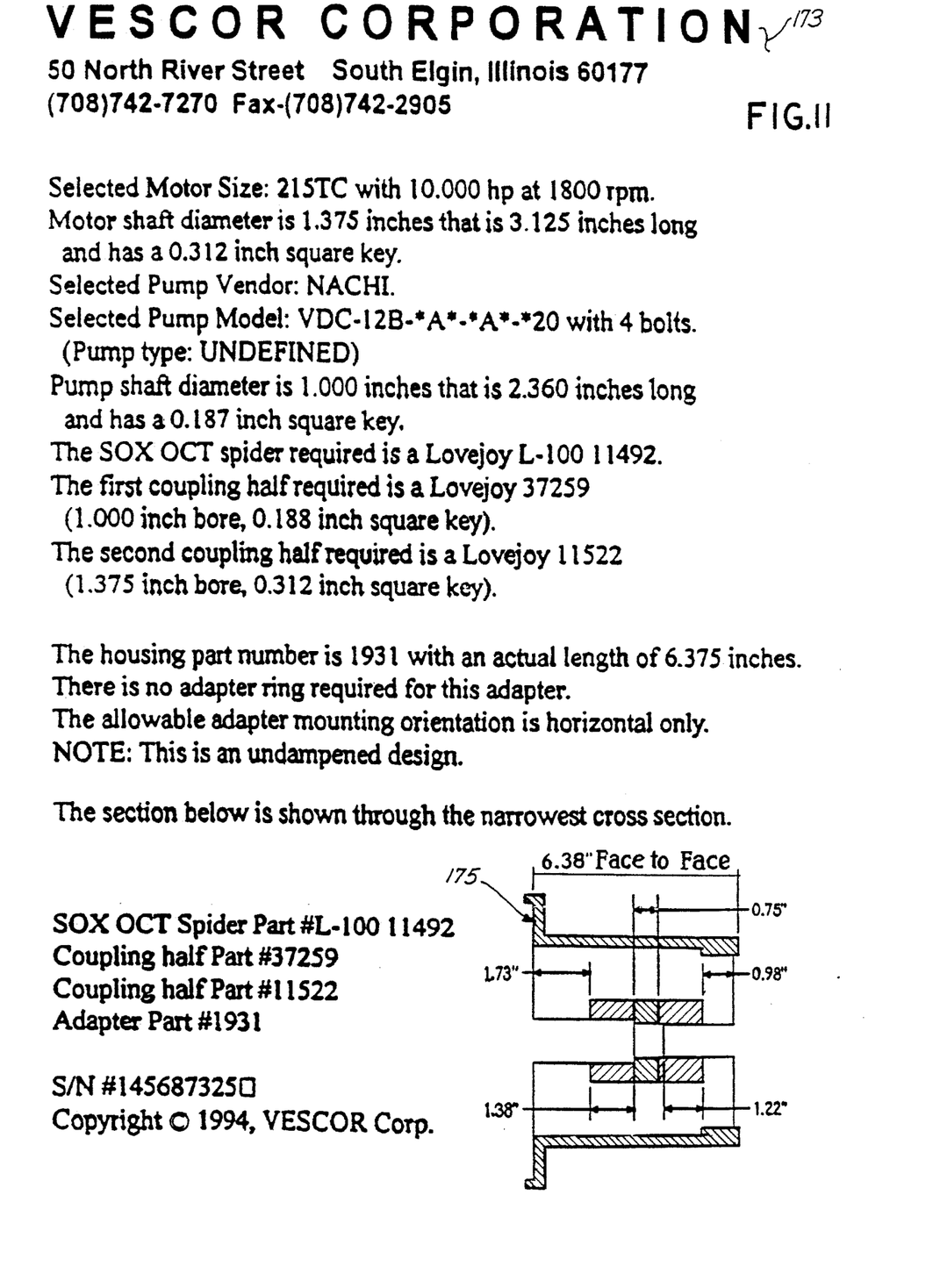
FIG. 11 is a visual display device screen illustrating a display of the output of a complete pump and motor assembly.

At step 230, the application program 20 next causes the visual display device 6 to display screen 173 which includes alphanumeric text all of the internally generated and stored output data concerning the components of the particular machinery application. The graphics for screen 173 are stored in database file 32E and are retrieved from memory device 12 by application program 20 and displayed on visual display device 6. Screen 173 of FIG. 11 includes drawing 175, which diagrammatically shows all of the dimensions of the completed assembly of the pump, motor, coupling, adapter, and any other options included. At step 232, the user may cause application program 20 to electrically transmit screen 173 to the output device 8, which may be a printer. Alternatively, the user may cause the application program 20 to remotely transmit screen 173 via another type of output device such as a standard modem or facsimile modem. Finally, at step 234, the application program 20 prompts the user to "RESET" to return to step 202 to restart the machinery component selection process again or to "QUIT" the application program 20.

It will be appreciated that the screens of FIGS. 3–11 are exemplary and that other screens, which prompt the user to input the proper information and which display the proper output data, may be equally suitable. Also, the order in which the application program 20 executes the steps in FIG. 2 and causes the visual display device 6 to display the screens of FIGS. 3–11 may be changed as necessary without departing from the spirit of the present invention. Finally, although the subject matter of the screens in this embodiment relate to couplings, adapters, pumps and motors, the same or similar apparatus and methods can be used to select many different components for other machinery applications.

While the present invention has been described herein in terms of a single preferred embodiment as described in this specification and the computer program listing appended hereto, those skilled in the art will appreciate that the invention can be practiced in many apparently widely different embodiments without departing from the true spirit and scope thereof. Thus, it is to be understood that the present invention is not limited to the specific embodiments thereof except as defined in the appended claims.

REFERENCE TO APPENDIX

Reference is hereby made to an appendix submitted herewith in accordance with 37 CFR 1.96(a). The appendix contains a computer program listing in the form of a total of 131 printed pages.

What is claimed is:

1. An apparatus for permitting a user thereof to automatically select adapters or couplings for use with a prime mover particular piece of machinery and a particular comprising:

alphanumeric a visual display device for displaying characters;

a data input device;

a central processing unit electrically connected to said visual display device and to said data input device;

a memory device having at least one database electrically connected to said central processing unit, said database storing:
    (i) data concerning a plurality of different kinds of rotating machinery including shaft specification data for each of said different kinds;
    (ii) data concerning a plurality of prime movers including shaft specification data for each of said prime movers;
    (iii) data concerning a plurality of adapters including specification data for each of said adapters; and
    (iv) data concerning a plurality of couplings including shaft specification data for each of said couplings; and application program means executable by said central processing unit
    (i) for prompting a user via said visual display device to input data via said data input device concerning a particular piece of machinery;
    (ii) for prompting the user via said visual display device to input data via said data input device concerning a particular prime mover;
    (iii) for comparing user inputted data to data in said databases; and
    (iv) for displaying information via said visual display device concerning the selection of an adapter and a coupling for use with said particular piece of machinery and said prime mover;

whereby the proper adapter and coupling may be selected for a particular piece of machinery and prime mover.

2. The apparatus of claim 1 and further including an output device electrically connected to said central processing unit for providing an output of said information concerning the selection of an adapter and a coupling.

3. The apparatus of claim 2 wherein said output device is a printer.

4. The apparatus of claim 1 wherein said data input device includes a mouse.

* * * * *